(12) United States Patent
Chang et al.

(10) Patent No.: US 8,741,722 B2
(45) Date of Patent: Jun. 3, 2014

(54) FORMATION OF DIVIDERS BETWEEN GATE ENDS OF FIELD EFFECT TRANSISTOR DEVICES

(75) Inventors: Josephine B. Chang, Mahopac, NY (US); Paul C. Chang, Bedford Hills, NY (US); Michael A. Guillorn, Yorktown Heights, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/605,136

(22) Filed: Sep. 6, 2012

(65) Prior Publication Data
US 2012/0329227 A1 Dec. 27, 2012

Related U.S. Application Data

(63) Continuation of application No. 13/118,689, filed on May 31, 2011.

(51) Int. Cl.
*H01L 21/336* (2006.01)

(52) U.S. Cl.
USPC .... 438/294; 438/299; 438/183; 257/E21.444; 257/401; 257/365

(58) Field of Classification Search
USPC .................................. 438/197–309
See application file for complete search history.

(56) References Cited

U.S. PATENT DOCUMENTS

| | | | |
|---|---|---|---|
| 6,297,107 B1 | 10/2001 | Paton et al. | |
| 7,183,195 B2 | 2/2007 | Lee et al. | |
| 7,452,766 B2 | 11/2008 | Aritome | |
| 7,768,128 B2 | 8/2010 | Cho et al. | |
| 2002/0056887 A1* | 5/2002 | Horstmann et al. | 257/508 |
| 2002/0192911 A1* | 12/2002 | Parke | 438/270 |
| 2005/0082628 A1* | 4/2005 | Kawasaki et al. | 257/435 |
| 2007/0080380 A1* | 4/2007 | Chang | 257/274 |
| 2008/0315309 A1* | 12/2008 | Chang et al. | 257/346 |
| 2009/0302372 A1 | 12/2009 | Chang et al. | |
| 2010/0038723 A1 | 2/2010 | Babich et al. | |
| 2010/0123202 A1 | 5/2010 | Hofmann | |

(Continued)

OTHER PUBLICATIONS

Ekinci et al., "20 nm Line/space patterns in HSQ fabricated by EUV interference lithography", Feb. 9, 2007, Microelectronic Engineering 84, pp. 700-704.*

(Continued)

*Primary Examiner* — Steven J Fulk
*Assistant Examiner* — Abbigale Boyle
(74) *Attorney, Agent, or Firm* — Cantor Colburn LLP; Vazken Alexanian

(57) ABSTRACT

A method includes defining active regions on a substrate, forming a dummy gate stack material over exposed portions of the active regions of the substrate and non-active regions of the substrate, removing portions of the dummy gate stack material to expose portions of the active regions and non-active regions of the substrate and define dummy gate stacks, forming a gap-fill dielectric material over the exposed portions of the substrate and the source and drain regions, removing portions of the gap-fill dielectric material to expose the dummy gate stacks, removing the dummy gate stacks to form dummy gate trenches, forming dividers within the dummy gate trenches, depositing gate stack material inside the dummy gate trenches, over the dividers, and the gap-fill dielectric material, and removing portions of the gate stack material to define gate stacks.

14 Claims, 7 Drawing Sheets

(56) References Cited

U.S. PATENT DOCUMENTS

2012/0025317 A1* 2/2012 Zhong et al. .............. 257/368
2012/0043593 A1* 2/2012 Zhong et al. .............. 257/288
2012/0205746 A1* 8/2012 Wang ....................... 257/368

OTHER PUBLICATIONS

Baek, et al., "Electron Beam Lithography Patterning of Sub-10 nm Line Using Hydrogen Silsesquioxane for Nanoscale Device Applications," J. Vac. Sci. Technol. B 23(6), Nov.-Dec. 2005, Copyright American Vacuum Society, pp. 3120-3123.

Basker, V.S. et al., "A 0.063 um2 FinFET SRAM Cell Demonstration with Conventional Lithography Using a Novel Integration Scheme with Aggressively Scaled fin and Gate Pitch," Copyright 2010 IEEE, 2010 Symposium on VLSI Technology Digest of Technical Papers, Jun. 15-17, 2010, pp. 19-20.

Guillorn, M. et al., "Hydrogen Silsesquioxane-based Hybrid Electron Beam and Optical Lithography for High Density Circuit Prototyping," J. Vac. Sci. Technol. B 27(6), Nov.-Dec. 2009, Copyright 2009 American Vacuum Society, pp. 2588-2592.

Shin, C. et al., "Full 3D Simulation of 6T-SRAM Cells for the 22nm Node," Copyright 2009 IEEE, Sep. 2009, 4 pages.

Veloso, A., et al., "Demonstration of Scaled 0.099um2 FinFET 6T-SRAM Cell Using Full-Field EUV Lithography for (Sub-)22nm Node Single-Patterning Technology," Copyright 2009 IEEE, IEDM09 pp. 301-304.

U.S. Appl. No. 13/118,689, filed May 31, 2011; Non-Final Office Action; Date Mailed: Dec. 19, 2012; pp. 1-9.

* cited by examiner

FORMATION OF DIVIDERS BETWEEN GATE ENDS OF FIELD EFFECT TRANSISTOR DEVICES

CROSS-REFERENCE TO RELATED APPLICATIONS

This is a continuation application of and claims priority from U.S. application Ser. No. 13/118,689, filed on May 31, 2011, the entire contents of which are incorporated herein by reference.

FIELD

The present invention relates to semiconductor field effect transistor device fabrication.

DESCRIPTION OF RELATED ART

In order to increase layout density, especially in high-density features such as static random access memory (SRAM), crisp patterning of gate line-ends has become more desirable. However, as gate pitch shrinks, the ability of photolithography to resolve 2-dimensional patterns is degraded. One solution is to use two patterning steps. The first patterning step is used define lines at the critical gate pitch, allowing features with small end-to-end spacing to merge into continuous lines. The second patterning step is then used to define small breaks in the merged gate lines. During the course of the device fabrication, the space between line ends tends to undesirably grow larger due to processes such as dry or wet etches that erode short edges faster than long edges. This eventual growth in end-to-end spacing is anticipated in the initial design and layout of the gate pattern. Spaces in between gates are filled by dielectric during the course of fabrication, either spacer material, liner material or middle-of-the-line dielectric material.

SUMMARY

According to one embodiment of the present invention, a method includes defining active regions on a substrate, forming a dummy gate stack material over exposed portions of the active regions of the substrate and non-active regions of the substrate, removing portions of the dummy gate stack material to expose portions of the active regions and non-active regions of the substrate and define dummy gate stacks, forming a gap-fill dielectric material over the exposed portions of the substrate and the source and drain regions, removing portions of the gap-fill dielectric material to expose the dummy gate stacks, removing the dummy gate stacks to form dummy gate trenches, forming dividers within the dummy gate trenches, depositing gate stack material inside the dummy gate trenches, over the dividers, and the gap-fill dielectric material, and removing portions of the gate stack material to define gate stacks.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Replacement gate is a flow for manufacturing semiconductor field effect transistors. There exist a multitude of variations of replacement gate flows, but they usually involve the formation of a dummy gate which is used as a place holder to define the location of where the final gate will eventually be formed. Source and drain junctions are defined using any combination of processes which can be self-aligned to the dummy gate, including, for example, spacer formation, ion implantation, impurity diffusion, epitaxial growth, and silicide formation. Then, with the source and drain in place high thermal budget steps such as dopant activation, epitaxial pre-cleans and growths, etc. can be performed before the final gate material is put in place. At some point during the flow, a gap-fill dielectric is deposited, and the surface of the structures is planarized so that the tops of the dummy gates are exposed. The dummy gate is removed, leaving trenches inside the dielectric. At some point after this, a final gate stack including is put in place and the wafer is planarized again to remove any gate stack materials not inside a trench left by the dummy gate.

The term printable dielectric is used to refer to a class of materials which can be spun on like a resist, and then cross-linked into a dielectric using a lithographic process such as, for example, 193 nm photolithography, extreme UV lithography (EUV), or electron beam lithography. Examples include HSQ (hydrogen silsesquioxane), which cross-links into $SiO_2$ under electron beam or EUV exposure, and MSQ (methyl silsesquioxane)-based materials which have been modified to be cross-linked into SiCOH materials by 193 nm or EUV lithography.

The embodiments described below include methods for forming gate features with small end-to-end spacing that are merged into a continuous line for the dummy gate patterning. The adjacent gate end-to-end definition is recovered after dummy gate removal and before deposition of the final gate stack by lithographically defining pillars of printable dielectric inside the dummy gate trenches.

Figure 1:
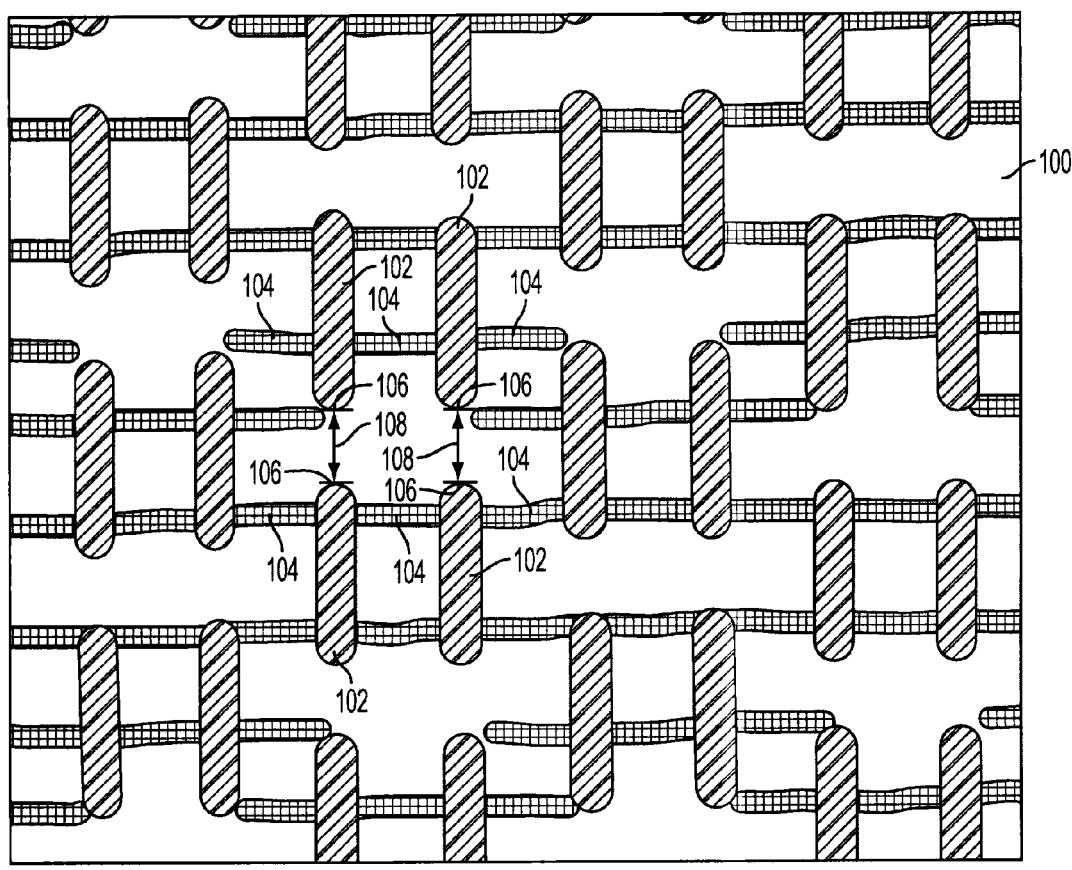
FIG. 1 illustrates a top view of an example of a prior art arrangement of FET devices.

FIG. 1 illustrates a top view of an example of a prior art arrangement of FET devices that include gate stacks 102 disposed on a substrate 100 with active source and drain regions 104. The gate stacks 102 include end portions 106 that define gaps 108. In the illustrated example, the gate stacks 102 have been fabricated in a line of gate stack material of which portions were removed to define the gate stacks 102 and the gaps 108. Following the removal of portions of the gate stack material, post processing steps such as, for example, etching and other similar steps undesirably erode end portions 106 resulting in an increase in the dimension of the gaps 108 and a rounding of the corners of the end portions 106. The increased dimension of the gaps 108 undesirably wastes space on the substrate 100 that may otherwise be used to reduce the geometric space consumed by the arrangement on the substrate 100.

Figure 2:
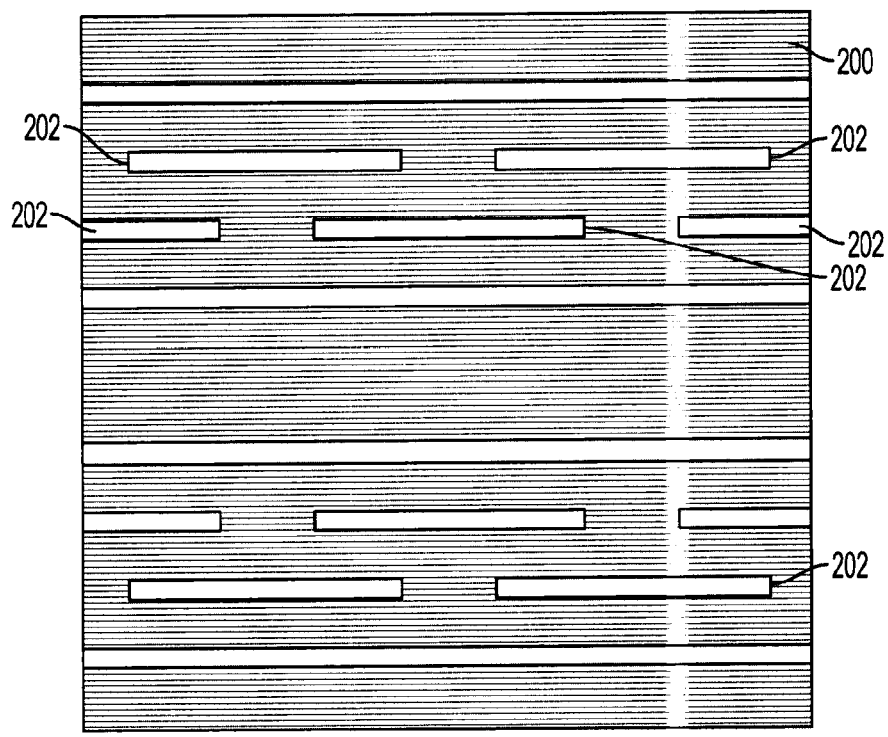
FIG. 2 illustrates a top view of patterned active regions.

FIGS. 2-9B illustrate an exemplary embodiment of a method that allows gate stacks to be formed on a substrate without increasing the dimension of gaps between the ends of the gate stacks during fabrication or post processing procedures. In this regard, FIG. 2 illustrates a top view of a substrate 200 that may include, for example, a silicon material or a silicon-on-insulator (SOI) material. The illustrated embodiment includes a plurality of active regions (source and drain regions) 202 embedded within non-active regions of the substrate 200. Active regions 202 have been isolated from one another through, for example, any combination of implanted wells, shallow trench isolation, or mesa isolation. The active regions 202 may be formed by, for example, a lithographic patterning and etching process. Alternatively, the active regions 202 may be formed by, for example, an epitaxial silicon material (e.g., Si or SiGe material) growth or deposition process. The active regions may be doped with impurities or by intrinsic semiconducting material. Though the illustrated embodiment shows the active regions 202 formed into FinFET or trigate devices, alternate embodiments may include the use of the active regions to form, for example planar silicon-on-insulator (SOI) FETs or nanowires that are suspended by pads.

Figure 3:
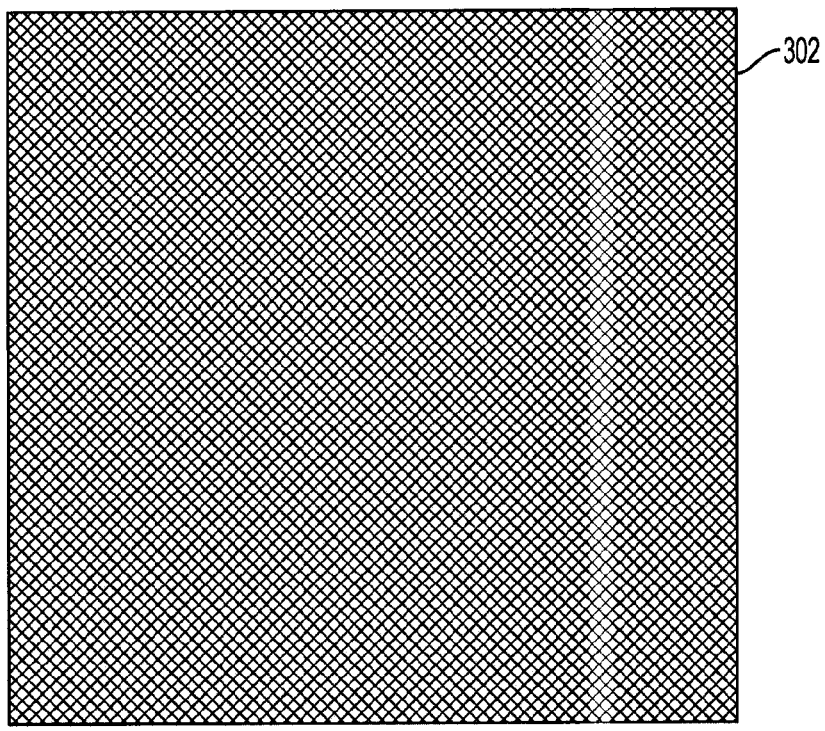
FIG. 3 illustrates a top view of the resultant structure following the deposition of a dummy gate stack on the substrate of FIG. 2.

FIG. 3 illustrates a top view of the resultant structure following the deposition of a dummy gate material 302 that is formed over the non-active regions of the substrate 200 and the source and drain regions 202 (of FIG. 2). The dummy gate material 302 may include, for example, a polysilicon material, a silicon nitride material, and/or another suitable material. In some replacement gate flows, the dummy gate stack may also include components such a gate dielectric layers which will not be subsequently removed. The dummy gate stack material 302 may be deposited using, for example, a chemical vapor deposition (CVD) process, a plasma enhanced chemical vapor deposition (PECVD) process, a spin on process, or an atomic layer deposition (ALD) process. Once the dummy gate material 302 is formed, the dummy gate material 302 may be planarized by, for example, a chemical mechanical polishing (CMP) process or another suitable process.

Figure 4:
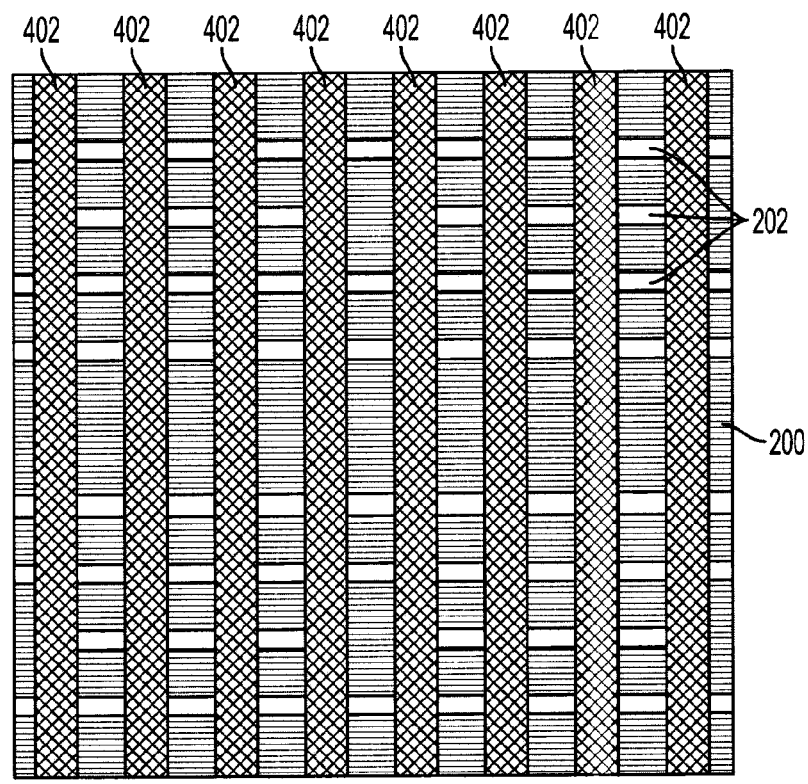
FIG. 4 illustrates a top view of the resultant structure following patterning of the dummy gate material of FIG. 3.

Once the dummy gate material 302 has been deposited, portions of the dummy gate material 302 may be removed to expose portions of the non-active regions of the substrate 200 and active regions 202. The exposed portion of the active regions become the source and drain contacts of the final FET device. In this regard, FIG. 4 illustrates a top view of the resultant structure following, for example, a lithographic patterning and etching process such as a reactive ion etching (RIE) process or other suitable process that removes portions of the dummy gate material 302 (of FIG. 3) to define lines of dummy gate stacks 402 crossing over portions of the active regions 202. Small end-to-end spacing between adjacent gate patterns and other difficult to print features that fall over non-active regions are eliminated from this patterning step, allowing features to merge into longer continuous lines to create a pattern that is predominately 1-dimensional, making it easier to resolve with lithography. Once the dummy gate stacks 402 have been defined, the exposed active regions 202 may be converted into source/drain contacts by, for example, some combination of spacer formation, ion implantation, impurity diffusion, source/drain recess, epitaxial growth of a source/drain material, dopant activation, and silicide. These source/drain formation process may include, for example, a deposition of a masking material (not shown) over portions of the substrate and the source and drain regions 202 to create FETs with different polarities (for example, n-type and p-type) of doping on the same substrate (as required for CMOS logic, for example). Tilted implants may also be used to dope the unexposed (channel) regions of the active regions 202 that are covered by the dummy gate stacks 402.

Figure 5:
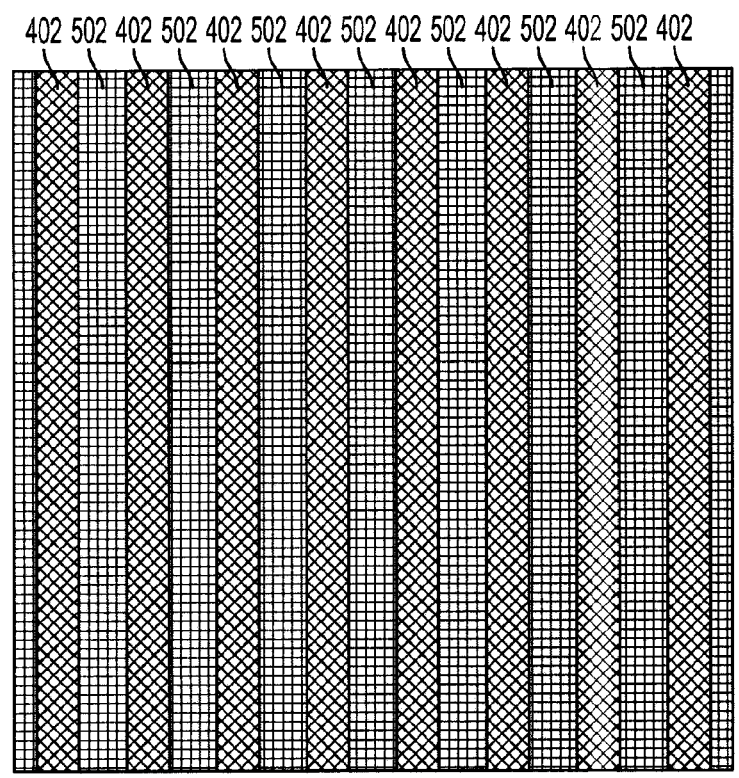
FIG. 5 illustrates a top view of the resultant structure following the deposition of a gap-fill dielectric material on the structure of FIG. 4 and subsequent planarization to expose the dummy gate material.

FIG. 5 illustrates a top view of the resultant structure following the deposition of a dielectric gap-fill material stack 502 that may include, for example, a silicon oxide or silicon nitride material, a low-k dielectric, or high-stress films. The dielectric material stack 502 is formed over the exposed portions of the source and drain regions 202, the substrate 200 (of FIG. 2) and the dummy gate stacks 402 (of FIG. 4). Once the dielectric material 502 is formed, portions of the dielectric material 502 (and in some embodiments, portions of the dummy gate stacks 402) may be removed using a CMP or etching process that reveals portions of the dummy gate stacks 402 with the dielectric material 502 disposed there between.

Figure 6:
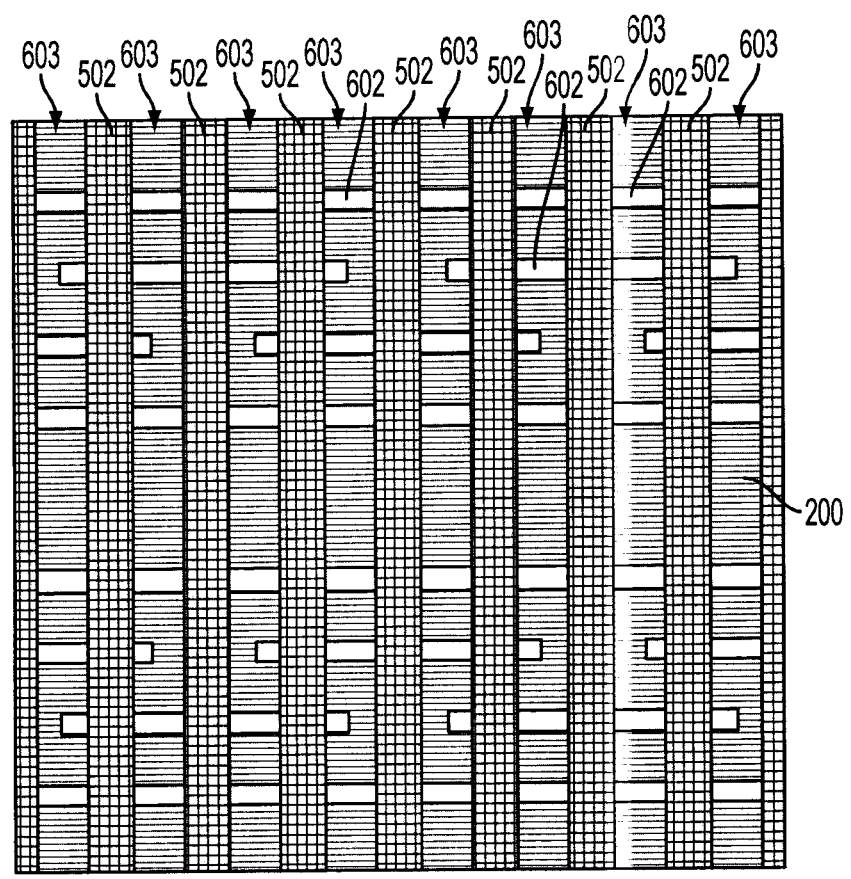
FIG. 6 illustrates a top view of the resultant structure following the removal of the dummy gate stacks of FIG. 5.

Referring to FIG. 6, there is shown a top view of the resultant structure following the removal of the dummy gate stacks 402 (of FIG. 4). The dummy gate stacks 402 may be removed by, for example, a selective chemical etching process that removes the dummy gate stacks 402 without appreciably removing the dielectric material 502, the non-active region of the substrate 200, or the active regions 202. In the illustrated embodiment, the removal of the dummy gate stacks 402 creates dummy gate trenches 603 within which channel regions 602 of FET devices are exposed. Channel treatments including, for example, fin definition, passivation anneals, sacrificial oxide growth and stripping, and even gate dielectric deposition may be performed. In exemplary embodiments, the dummy gate stack may be completely removed. In another embodiment, upper layers of the dummy gate stack may be removed, while lower layers of the gate stack are not removed.

Figure 7A:
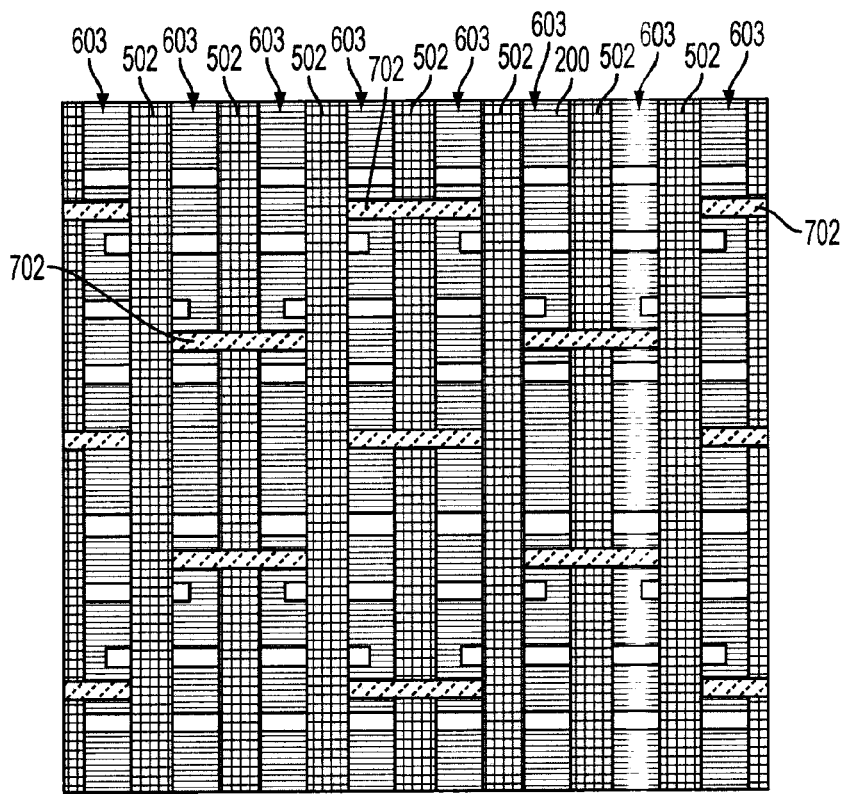
FIG. 7A illustrates a top view of the resultant structure following the lithographic patterning of a printable dielectric material into dividers within the dummy gate trenches shown in the structure of FIG. 6.
Figure 7B:
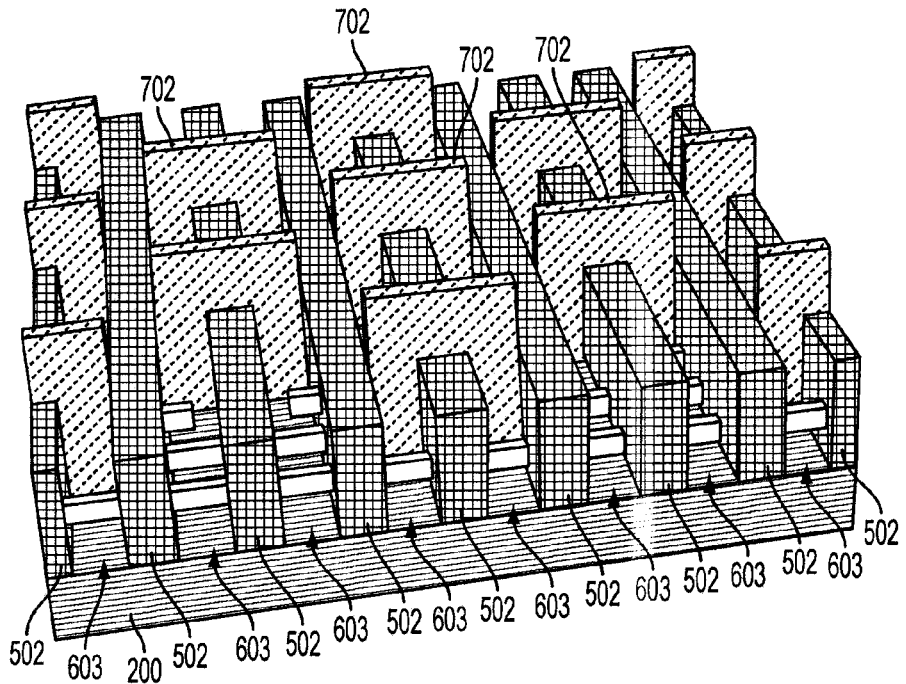
FIG. 7B illustrates a perspective view of FIG. 7A

FIG. 7A illustrates a top view of the resultant structure following the lithographic patterning of a printable dielectric material into dividers 702 within the dummy gate trenches 603 over non-active regions. The dividers 702 divide the dummy gate trenches 603 into a plurality of smaller isolated trenches. Small end-to-end spacings and other features that were not defined in the dummy gate stacks 402 pattern, but are needed in the final gate pattern are defined using dividers 702. Any extension of the dividers 702 out of the gate trenches 603 over onto the dielectric material 502 is inconsequential, however such extension may be performed in order to make the dividers easier to print. Dividers 702 are formed by a spinning-on a printable dielectric material such as those described above that may include, for example, a hydrogen silsesquioxane (HSQ) or a photosensitized methyl silesquioxane (MSQ). In the areas where dividers are desired, the printable dielectric is cross-linked through a lithographic process such as ebeam-lithography, EUV, or 193 nm photolithography. Any printable dielectric material which is not cross-linked is then removed with a developer which removed uncross-linked material selectively to cross-linked material. An example of a developer suitable for HSQ is dilute Tetramethylammonium hydroxide (TMAH). FIG. 7B illustrates a perspective view of the resultant structure following the formation of the dividers 702.

Figure 8A:
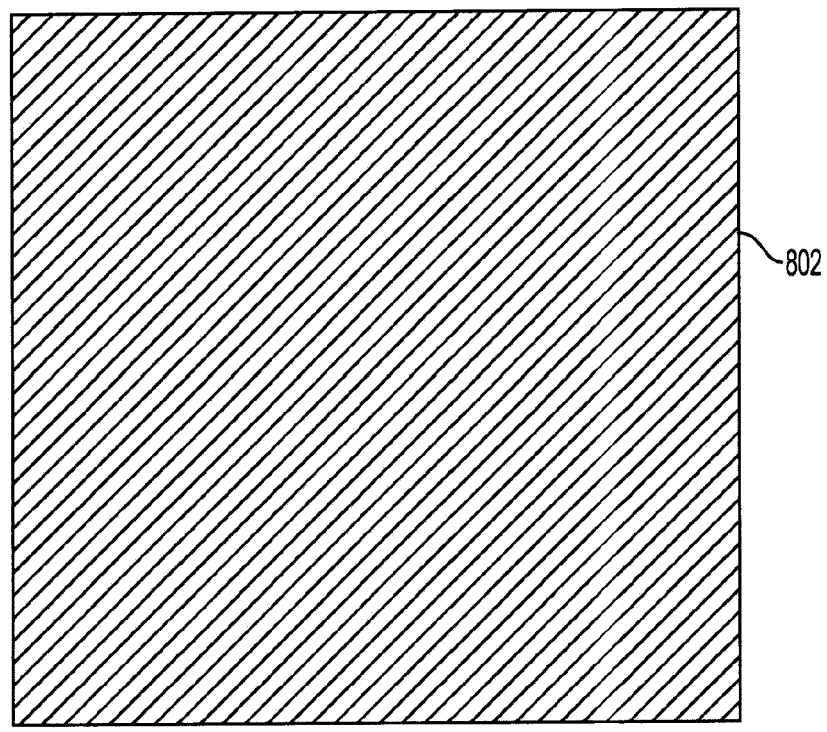
FIG. 8A illustrates a top view following the deposition of gate stack material on the structure of FIG. 7A.
Figure 8B:
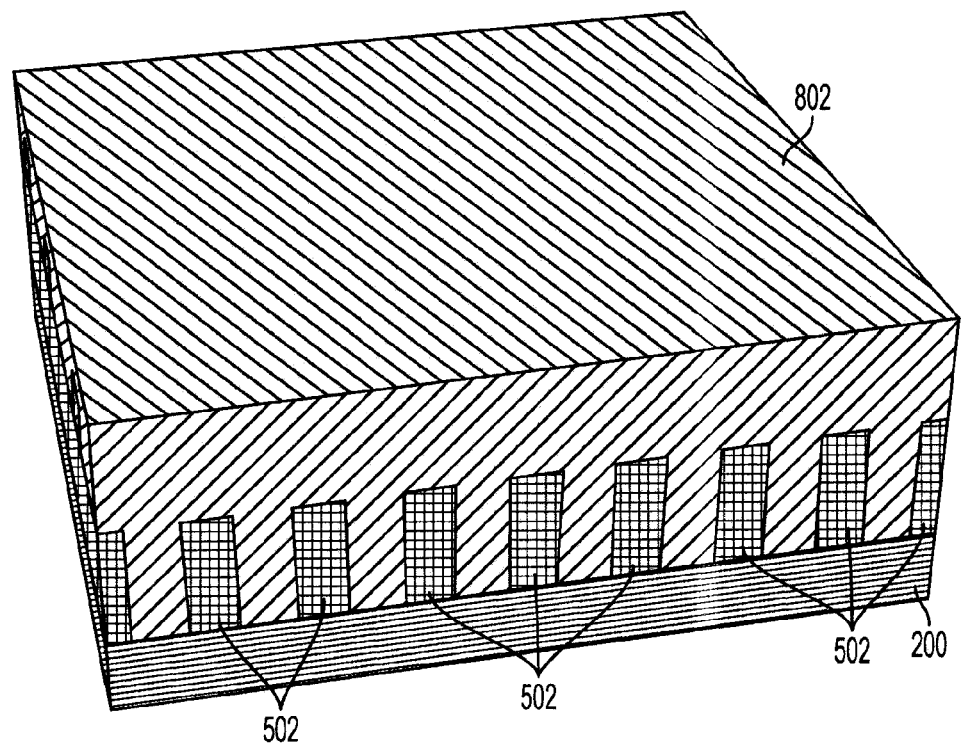
FIG. 8B illustrates a perspective view of FIG. 8A.

FIG. 8A illustrates a top view following the formation of gate stack material 802 over the exposed portions of the spacers 702 (of FIG. 7), dielectric material 502 (of FIG. 5), the channel regions 602 (of FIG. 6) and the non-active regions of the substrate 200. The gate stack material 802 of the illustrated embodiment may include any suitable gate stack material, and is not limited to a single type or layer of material. For example, the gate stack material 802 may include materials that may form a dielectric portion and a gate electrode portion of a complimentary metal oxide semiconductor (CMOS) FET device or a metal oxide semiconductor field effect transistor (MOSFET) device or any other type of FET device. Examples of materials that may be used to form the dielectric portion may include $SiO_2$, $SiO_xN_y$, or high-k materials such as $HfO_2$, $HfO_xN_y$, $HfSiO_xN_y$, $Al_2O_3$, and ZrO, while examples of the materials that may be used to for the gate electrode portion of the gate stack material 802 may include TiN, TaN, TaAlN, Al, Ti, AlO and Si. The gate stack materials 802 gate stack materials 802 may be formed in any suitable order using any suitable deposition process such as, for example, CVD, PECVD, spin on, or ALD processes. FIG. 8B illustrates a perspective view of the gate stack material 802, the dielectric material 502, and the substrate 200.

Figure 9A:
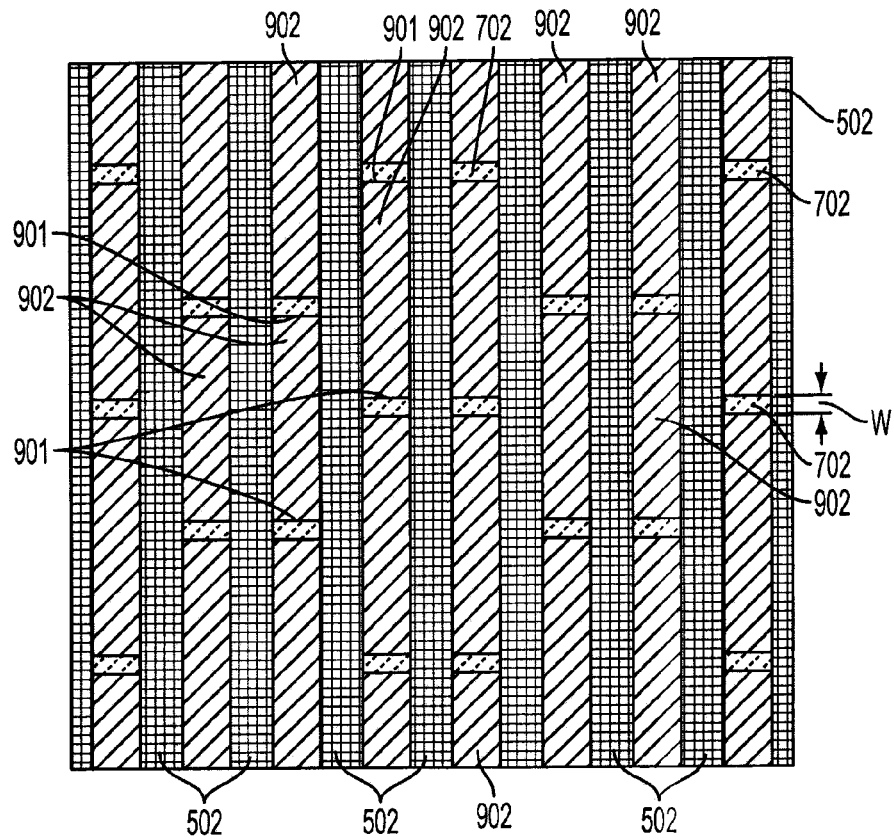
FIG. 9A illustrates a top view of the resultant structure following the planarization of the structure of FIG. 8A.
Figure 9B:
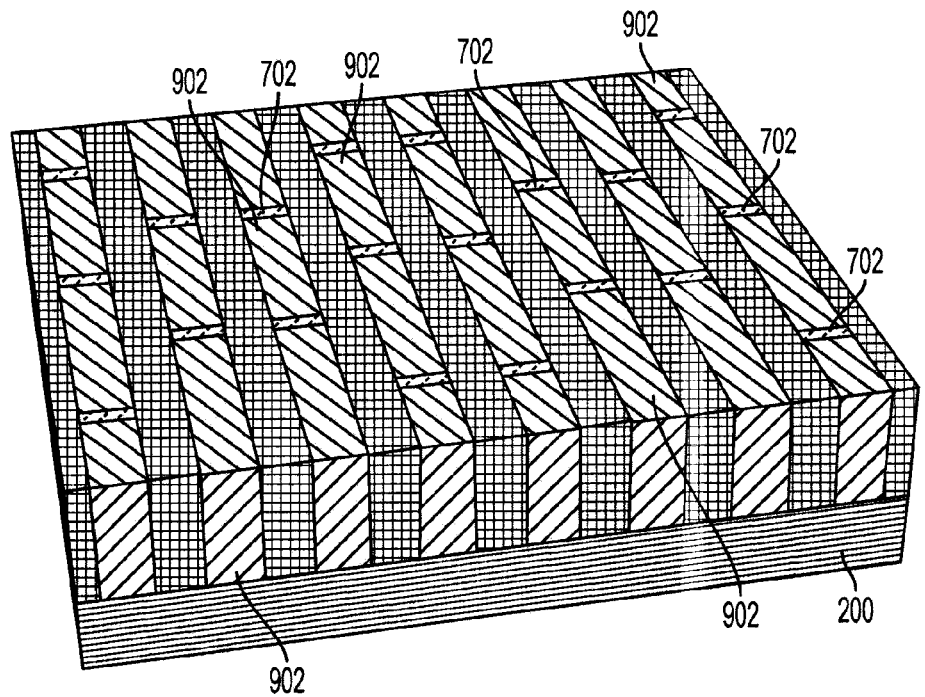
FIG. 9B illustrates a perspective view of structure FIG. 9A.

FIG. 9A illustrates a top view of the resultant structure following the removal of portions of the gate stack material 802 (of FIG. 8) and in some embodiments, portions of the spacers 702 and the dielectric material 502 resulting in the definition of gate stacks 902. The resultant structure may be formed by, for example, a CMP or other suitable planarization process. The resultant structure illustrates how the spacers 702 define longitudinal end portions 901 of the gate stacks 902, while the dielectric material 502 defines the transverse sides of the gate stacks 902. FIG. 9B illustrates a perspective view of the non-active regions of the substrate 200, the gate stacks 902, the dividers 702, and the dielectric material 502.

Following the formation of the gate stacks 902 (of FIG. 9A and 9B), one can proceed with a replacement gate flow after gate stack planarization. Subsequent processes may include, for example, trench silicide formation, dielectric deposition, via formation and metallization, and metal interconnect formation and metallization.

The embodiments described above allow the gate stacks 902 to be formed with a space between end portions 901 that is defined by the width (w) of the dividers 702. Thus, once the dividers 702 have been formed to a desired width, the space between end portions 901 of the gate stacks 902 will remain appreciably defined throughout the fabrication process.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for forming a semiconductor device, comprising:
    defining active regions on a substrate;
    forming a dummy gate stack material over exposed portions of the active regions of the substrate and non-active regions of the substrate;
    removing portions of the dummy gate stack material to expose portions of the active regions and non-active regions of the substrate and define dummy gate stacks;
    forming a gap-fill dielectric material from a first dielectric material over the exposed portions of the substrate;
    removing portions of the gap-fill dielectric material to expose the dummy gate stacks;
    removing the dummy gate stacks to form dummy gate trenches;
    forming dividers from a second dielectric material within the dummy gate trenches, wherein portions of the dividers are formed over top surfaces of the gap-fill dielectric material;
    depositing gate stack material inside the dummy gate trenches, over the dividers, and the gap-fill dielectric material; and
    removing portions of the gate stack material to define gate stacks, the gate stacks having a longitudinal axis along a first direction, wherein remaining portions of the gap-fill material the first dielectric material also have a longitudinal axis along the first direction, and wherein the dividers have a longitudinal axis in a second direction orthogonal to the first direction, and wherein locations of the plurality of dividers are independent from self-alignment to source and drain diffusion regions.

2. The method of claim 1, wherein the dummy gate stacks include a first dummy gate stack arranged in parallel to a second dummy gate stack.

3. The method of claim 1, wherein the dividers include a first divider arranged in parallel with respect to a second divider, the longitudinal axes of the first divider and the second divider arranged orthogonal to the longitudinal axis of the first dielectric material.

4. The method of claim 1, wherein the second dielectric material of the dividers is formed by an extreme ultraviolet (EUV) lithography process.

5. The method of claim 1, wherein the second dielectric material of the dividers includes a printable dielectric material formed by a lithographic process.

6. The method of claim 1, wherein the dividers include a hydrogen silsesquioxane material.

7. The method of claim 1, wherein the dividers include a methyl silsesquioxane material.

8. The method of claim 1, wherein the method further comprises implanting ions in exposed portions of source and drain regions prior to forming the dielectric material over the exposed portions of the substrate and the source and drain regions.

9. The method of claim 1, wherein the dummy gate stack material includes a polysilicon material.

10. The method of claim 1, wherein the dividers define a gap region between end portions of the gate stacks along a same longitudinal axis.

11. The method of claim 1, wherein a width of the dividers defines a gap region between the end portions of the gate stacks along a same longitudinal axis.

12. The method of claim 1, wherein the active regions include a first source and drain region and a second source and drain region, the first source and drain region arranged in parallel to the second source and drain region.

13. The method of claim 1, further comprising defining source and drain regions by forming a first source and drain region and a second source and drain region in a silicon material on the substrate.

14. The method of claim 1, wherein the removal of the dummy gate stacks exposes a channel region.

* * * * *